(12) United States Patent
Goh et al.

(10) Patent No.: US 10,658,238 B2
(45) Date of Patent: May 19, 2020

(54) SEMICONDUCTOR PACKAGES HAVING AN ELECTRIC DEVICE WITH A RECESS

(71) Applicant: STMicroelectronics Pte Ltd, Singapore (SG)

(72) Inventors: Kim-Yong Goh, Singapore (SG); Xueren Zhang, Singapore (SG); Yiyi Ma, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 45 days.

(21) Appl. No.: 15/784,764

(22) Filed: Oct. 16, 2017

(65) Prior Publication Data

US 2018/0040514 A1 Feb. 8, 2018

Related U.S. Application Data

(62) Division of application No. 13/853,856, filed on Mar. 29, 2013, now Pat. No. 9,824,924.

(51) Int. Cl.
| | |
|---|---|
| *B81B 7/00* | (2006.01) |
| *H01L 21/78* | (2006.01) |
| *H01L 23/00* | (2006.01) |
| *H01L 27/146* | (2006.01) |
| *H01L 23/053* | (2006.01) |

(52) U.S. Cl.
CPC ............ *H01L 21/78* (2013.01); *B81B 7/0048* (2013.01); *H01L 24/32* (2013.01); *H01L 24/83* (2013.01); *H01L 23/053* (2013.01); *H01L 24/13* (2013.01); *H01L 24/29* (2013.01); *H01L 24/48* (2013.01); *H01L 27/14618* (2013.01); *H01L 2224/13101* (2013.01); *H01L 2224/16225* (2013.01); *H01L 2224/27013* (2013.01); *H01L 2224/29101* (2013.01); *H01L 2224/29198* (2013.01); *H01L 2224/32058* (2013.01); *H01L 2224/45099* (2013.01); *H01L 2224/48091* (2013.01); *H01L 2224/73265* (2013.01); *H01L 2224/83007* (2013.01); *H01L 2924/00* (2013.01); *H01L 2924/00014* (2013.01); *H01L 2924/10157* (2013.01); *H01L 2924/10158* (2013.01); *H01L 2924/12042* (2013.01); *H01L 2924/16151* (2013.01)

(58) Field of Classification Search
CPC ....... H01L 21/78–782; H01L 27/14618; H01L 24/32; H01L 24/83; H01L 2924/00; H01L 2924/00012; H01L 2224/48227; B81B 7/0048
USPC .......................................................... 257/68
See application file for complete search history.

(56) References Cited

U.S. PATENT DOCUMENTS

| | | |
|---|---|---|
| 5,668,059 A | 9/1997 | Christie et al. |
| 7,301,222 B1 | 11/2007 | Patwardhan et al. |
| 2004/0140546 A1* | 7/2004 | Lee ..................... H01L 23/3128 257/686 |

(Continued)

*Primary Examiner* — Patricia D Reddington
(74) *Attorney, Agent, or Firm* — Seed Intellectual Property Law Group LLP (57) ABSTRACT

Embodiments are directed to a package that includes an electric device having a recess. In one embodiment, the electric device is a sensor and the recess reduces signal drift of the sensor caused by thermal expansion of the package. In another embodiment, the recess is substantially filled with adhesive material, thus increasing adhesion between the electric device and a substrate of the package while at the same time allowing for lower adhesive fillets.

19 Claims, 6 Drawing Sheets

(56) References Cited

U.S. PATENT DOCUMENTS

| | | | |
|---|---|---|---|
| 2005/0017252 A1* | 1/2005 | Streubel | H01L 23/3672 |
| | | | 257/79 |
| 2006/0216864 A1 | 9/2006 | Tan et al. | |
| 2007/0290364 A1* | 12/2007 | Gupta | H01L 23/34 |
| | | | 257/777 |
| 2008/0185706 A1* | 8/2008 | Wang | B81C 1/00269 |
| | | | 257/690 |
| 2009/0200684 A1* | 8/2009 | Masuda | H01L 21/563 |
| | | | 257/778 |
| 2010/0224945 A1 | 9/2010 | Takahata et al. | |
| 2012/0012949 A1* | 1/2012 | Winkler | G01L 9/0054 |
| | | | 257/415 |
| 2012/0306031 A1 | 12/2012 | Lo et al. | |
| 2013/0119533 A1 | 5/2013 | Chen et al. | |
| 2013/0157414 A1* | 6/2013 | Ho | H01L 21/78 |
| | | | 438/113 |

\* cited by examiner

SEMICONDUCTOR PACKAGES HAVING AN ELECTRIC DEVICE WITH A RECESS

BACKGROUND

Technical Field

Embodiments of the present disclosure are related to semiconductor packages that includes at least one electric device.

Description of the Related Art

Reliability of semiconductor devices is of significant importance. Various issues are known to cause reliability problems in semiconductor devices. For instance, heat generated by the operation of a semiconductor device that remains in the package can cause reliability issues. One reason for this is that packages are formed of varying types of materials. Some of the different materials may have different coefficients of thermal expansion (CTE), and thus heat that remains in the package can result in varying thermal expansion rates thereby causing distortions or delamination within the package.

BRIEF SUMMARY

Embodiments are directed to a package that includes an electric device having a recess. In one embodiment, the recess is substantially filled with adhesive material improving adhesion between the electric device and a substrate of the package while at the same time allowing for lower adhesive fillets. In another embodiment, the electric device is a sensor and the recess reduces signal drift of the sensor caused by thermal expansion of the package.

DETAILED DESCRIPTION

Figure 1:
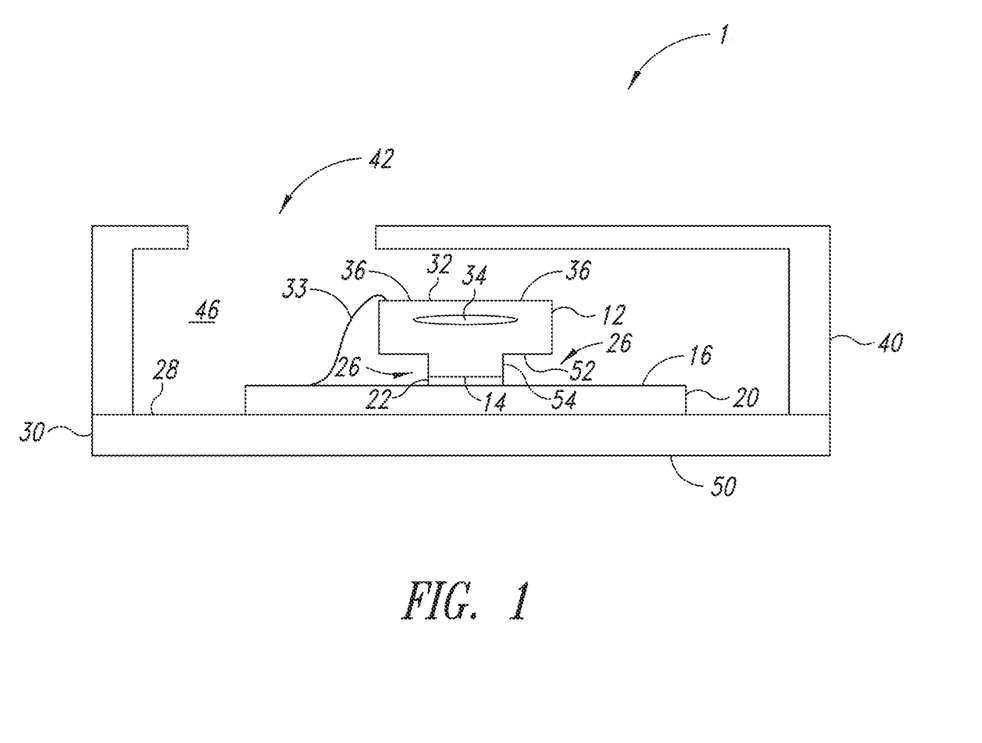
FIG. 1 is a side view of a package in accordance with one embodiment of the present invention.

FIG. 1 shows a side view of a package 10 according to one embodiment of the present disclosure. The package 10 includes an electric device, such as a sensor 12, having a back surface 14 secured to an upper surface 16 of an integrated circuit 20 by an adhesive 22, such as glue or tape. The back surface 14 of the sensor 12 includes a recess 26, the details of which will be described below. The integrated circuit 20 is secured to an upper surface 28 of a substrate 30, thereby fixing the sensor 12 relative to the substrate 30.

In FIG. 1, the sensor 12 is a pressure sensor. However, the sensor 12 may be any sensor, such as a micro-electromechanical sensor (MEMS), or any electric device. In the illustrated embodiment, the pressure sensor 12 includes a membrane 32 that is located above a cavity 34 suspending the membrane 32. At the outer edges of the membrane 32 are transducer elements 36, such as piezoresistors, which are configured to measure deflections of the membrane 32 and provide corresponding electrical signals indicative of the measurement to the integrated circuit 20. In one embodiment, the pressure sensor 12 is formed in silicon.

The sensor 12 is in electrical communication with the integrated circuit 20 by way of one or more bonding wires 33. The integrated circuit 20 is any device configured to receive and process signals from the sensor 12. In one embodiment, the integrated circuit 20 is an application specific integrated circuit (ASIC).

A cap 40 having an opening 42 is also secured to the upper surface 28 of the substrate 30 outward of the integrated circuit 20 and the sensor 12 forming a cavity 46 therein. The cap 40 is configured to protect the pressure sensor 12. The opening 42 in the cap 40 places the cavity 46 in fluid communication with the external environment outside of the package 10. The membrane 32 of the pressure sensor 12 deflects in response to changes in pressure in the cavity 46.

Although not shown in FIG. 1, the substrate 30 includes one or more conductive and insulative layers. An outer surface 50 of the substrate 30 may include lands, solder balls, and the like that are configured to electrically couple the sensor 12 and/or the integrated circuit 20 to a board or another electric device. An insulative layer in the substrate 30 may comprise a polymer, glass, or the like. In one embodiment, one or more insulative layers in the substrate 30 are fiber reinforced polymer.

As described above, thermal expansion of various components of packages can cause reliability issues of the package. In particular, materials having different coefficients of thermal expansion (CTE) expand at different rates. In FIG. 1, the CTEs of the sensor 12 and integrated circuit 20 are substantially different than the CTE of the substrate 30. For instance, in one embodiment the sensor 12 and the integrated circuit 20 comprise silicon, which has a CTE of about 2.6. The substrate 30, however, may have a CTE that is more than 5 times greater than the CTE of the sensor 12 and the integrated circuit 20. For instance, in the embodiment in which one or more insulative layers of the substrate 30 is made of fiber reinforced polymer, the CTE is about 15. Thus, the substrate 30 expands to a substantially larger change in volume for the same temperature change than the sensor 12 and the integrated circuit 20.

The inventors realized that the substantially different CTEs between the substrate 30 and the sensor 12 can cause signal drift in the sensor 12. That is, due to the heat created during operation, the substrate 30 expands and causes distortions in the sensor 12. The distortions cause a deflection in the membrane 32 that is not due to a change in pressure, thus resulting in a measurement error.

The recess 26 on the back surface of the sensor 12 is configured to decrease the measurement error in the sensor 12. The recess 26 includes a back surface portion 52 and a side surface portion 54. The recess 26 may extend around the entire perimeter of the sensor 12 or extend around a portion of the perimeter of the sensor 12. The dimension of the back surface portion 52 may have any dimension to maintain suitable surface area on the back surface 14 of the sensor 12 to remain secured to the integrated circuit 20 by the adhesive 22. In one embodiment, the back surface 14 of the sensor 12 has one-half its original surface area to maintain adhesion with the integrated circuit 20. In that regard, the back portion 52 may have a dimension of one-fourth the original surface area of the back surface 14 of the sensor 12 and extend around the entire perimeter of the sensor 12.

In the illustrated embodiments, the back surface 14 of the sensor 12 has a dimension that is less than the membrane 32 of the sensor 12. In particular, the back surface 14 of the sensor 12 below the transducer elements 36 is not secured to the integrated circuit 20 by the adhesive 22. Thus, as the substrate 30 expands under thermal strain, the integrated circuit 20 is somewhat distorted by this expansion. Because portions of the back surface 14 of the sensor 12 are not secured to the integrated circuit 20, the amount of distortion caused in the integrated circuit 20 that is applied to the sensor 12 is reduced. Furthermore, having the recess 26 at locations below transducer elements 36 such that the back surface 14 of the sensor 12 below the transducer elements 36 is not secured to the upper surface 16 of the integrated circuit 20, reduces any measurement errors caused by CTE mismatch between the sensor 12 and the substrate 30. In that regard, although the integrated circuit 20 may become distorted in view of the CTE mismatch between the integrated circuit 20 and the substrate 30, the amount of distortion that is applied to the sensor 12 is reduced.

Although not shown, it is to be appreciated that in some embodiments, the sensor 12 may be secured directly to the substrate 30 by the adhesive 22. In this embodiment, as the substrate 30 expands under thermal strain, portions of the sensor 12 are somewhat distorted, but again, with the transducer elements 36 being suspended over the substrate 30, the membrane proximate the transducer elements 36 has a reduced amount of distortion due to the thermal expansion of substrate 30. In this embodiment, the integrated circuit 20 may also be secured to the substrate 30 next to the sensor 12 or may be external to the package.

Figure 2:
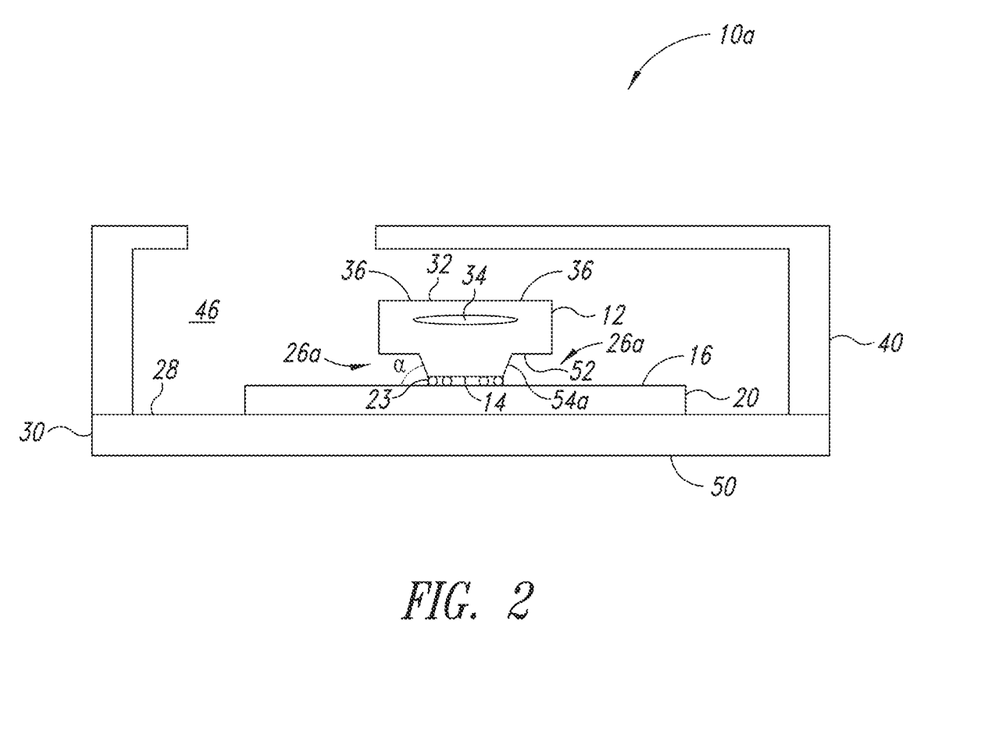
FIG. 2 is a side view of another package in accordance with one embodiment of the present invention.

Although the illustrated embodiment shows a rectangular shaped recess 26, the shape of the recess may vary. FIG. 2 shows another package 10a in which the recess 26 is an angled recess 26a. That is, a side surface portion 54a of the recess 26a forms an acute angle α with the upper surface 16 of the integrated circuit 20. The angle α may be any angle suitable to support the membrane 32 of the sensor 12. In some embodiments, the acute angle is between about 40° and 70°, and in one embodiment, the angle is about 60°. In another embodiment, the side surface portion 54 forms an obtuse angle with the upper surface 16 of the integrated circuit 20. In one embodiment, the recess may remain at an acute angle up to the top edge of the sensor. In yet another embodiment, the recess 26 is concave shaped.

In the embodiment of FIG. 2, the sensor 12 is in electrical communication with the integrated circuit by way of conductive balls 23, such as solder balls. The conductive balls 23 may be used as the electrical communication between the sensor 12 and the integrated circuit 20 in the package 10 of FIG. 1. Similarly, the bonding wire 33 may be used as the electrical communication between the sensor 12 and the integrated circuit 20 in the package 10a of FIG. 2.

Figure 3:
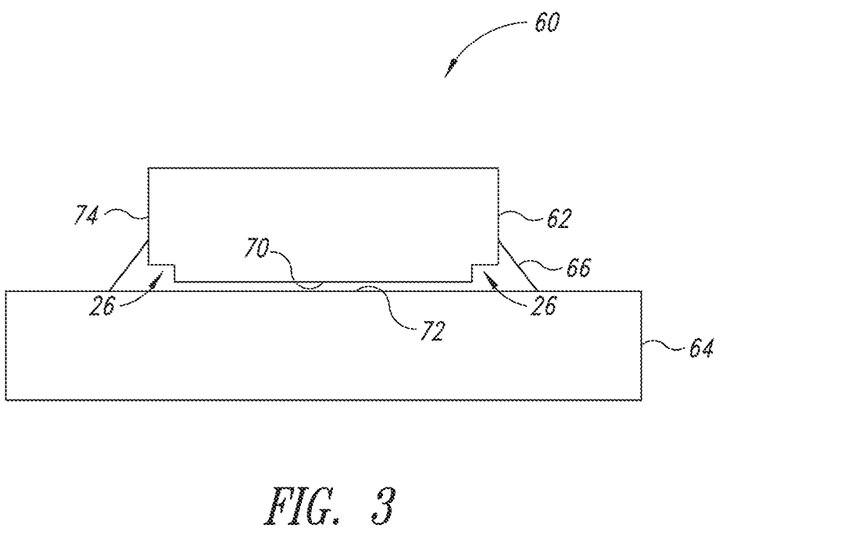
FIG. 3 is a side view of another package in accordance with one embodiment of the invention.

FIG. 3 is side view of a portion of package 60 in accordance with another embodiment of the present disclosure. In this embodiment, an electric device 62 is secured to a substrate 64 using an adhesive material 66. The electric device 62 includes the recess 26 on at least a portion of its perimeter. The electric device 62 may be a sensor, such as a micro-electromechanical sensor (MEMS), an integrated circuit, or any other electric device. The substrate 64 in this embodiment may be of a conductive material, an insulative material, or include one or more layers of both.

The adhesive material 66 is any flowable adhesive, such as glue, solder paste, and the like. The adhesive material 66 extends between a back surface 70 of the electric device 62 and an upper surface 72 of the substrate 64 and substantially fills the recess 26. The adhesive material 66 fills the recess 26 any amount sufficient to improve adhesion between the electric device 62 and the substrate 64. In the illustrated embodiment, a portion of the adhesive material 66 extends along a side surface 74 of the electric device 62 forming a fillet. The fillet preferably remains below 75% of the height of the electric device, and in some embodiments remains below 50%.

Figure 4A:
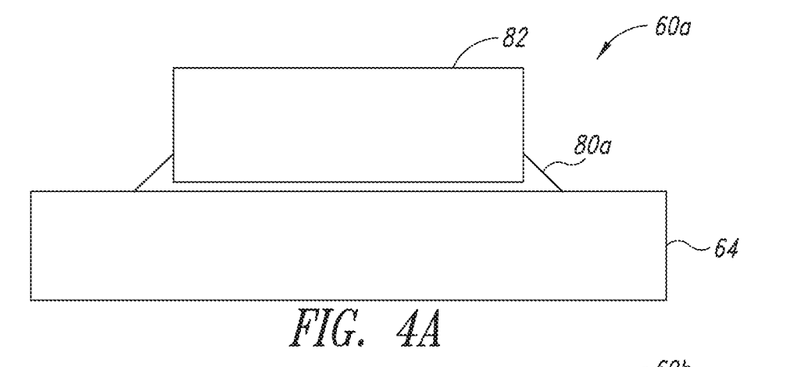
FIGS. 4A-4D are side views of various packages in accordance with the prior art.
Figure 4B:
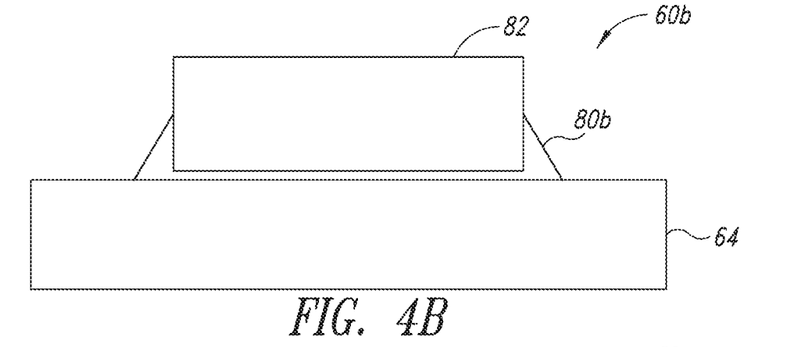
Figure 4C:
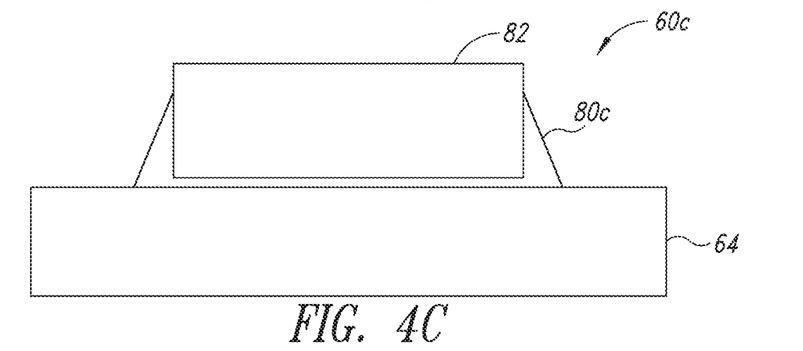
Figure 4D:
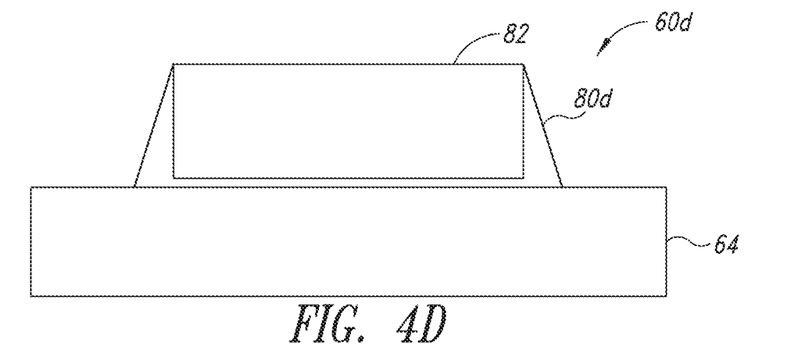

As will be explained below, the inventors correlated delamination of oxide on electric devices due to high adhesive fillet heights. FIGS. 4A-4D show various partial packages 60a-60d, respectively each package having a different adhesive fillet height. In each of FIGS. 4A-4D, an electric device 82 without a recess is attached to a substrate 64. FIG. 4A shows the adhesive fillet 80a having a height that is 25% of the electric device 82. FIG. 4B shows the adhesive fillet 80b having a height that is 50% of the electric device 82. FIG. 4C shows the adhesive fillet 80c having a height that is 75% of the electric device 82. FIG. 4D shows the adhesive fillet 80d having a height at 100% of the electric device 82.

Figure 5:
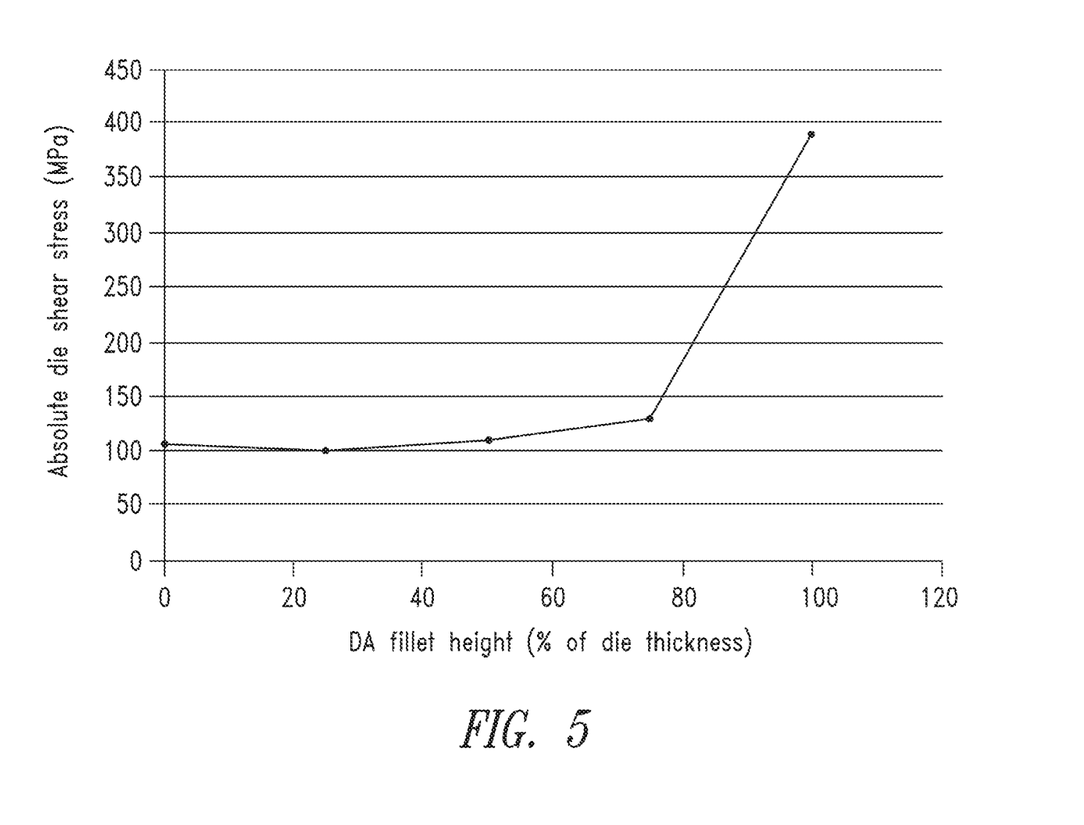
FIG. 5 is a graph illustrating shear stress dependence on fillet height.

FIG. 5 illustrates graphical results of a finite element analysis of shear stress acting on the die for the various adhesive fillet heights of FIGS. 4A-4D. As shown in the FIG. 5, the inventors discovered that sheer stress of the electric device increases as the adhesive fillet height increases, and, in fact, increases substantially when the fillet height is equal to the height of the electric device.

The recess 26 on the back surface 70 of the electric device 62 increases adhesion between the electric device 62 and the substrate 64. In particular, the recess 26 allows for more adhesive material 66 to be located therein, thereby increasing the adhesion between the electric device 62 and the substrate 64. That is, the recess 26 is located between the electric device 62 and the substrate 64 allowing more adhesive material 66 therebetween. In that regard, the height of the adhesive fillet along a side surface 74 of the electric device 62 may be reduced, while at the same time maintain suitable adhesion between the electric device 62 and the substrate 64.

Conversely, in the images shown in FIGS. 4A-4D, in order to increase the amount of adhesion between the electric device 82 and the substrate 64, the fillet height is increased along the side surface of the electric device 82, which as discussed above has now been identified as associated with causing oxide to delaminate on the electric device 82.

As discussed in reference to FIG. 1, although the recess 26 is shown as a square in FIG. 3, the recess 26 may have any shape suitable that allows adhesive material 66 to fill an opening between the electric device 62 and the substrate 64. For instance, in some embodiments the recess 26 is rectangular or concave in cross-section.

Figure 6A:
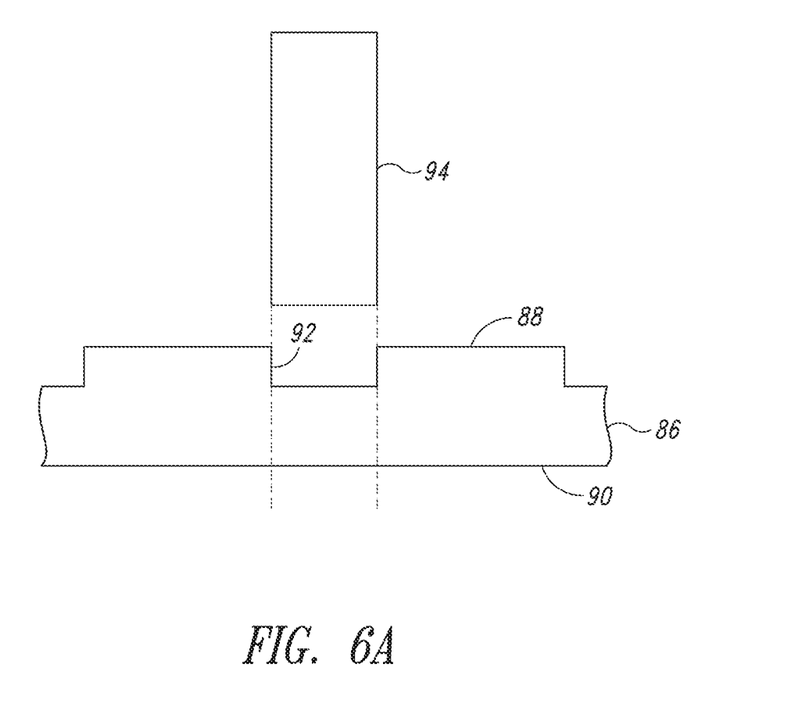
FIGS. 6A and 6B illustrate steps in accordance with one embodiment for forming the recess for the electric device in the packages of FIGS. 1 and 5.
Figure 6B:
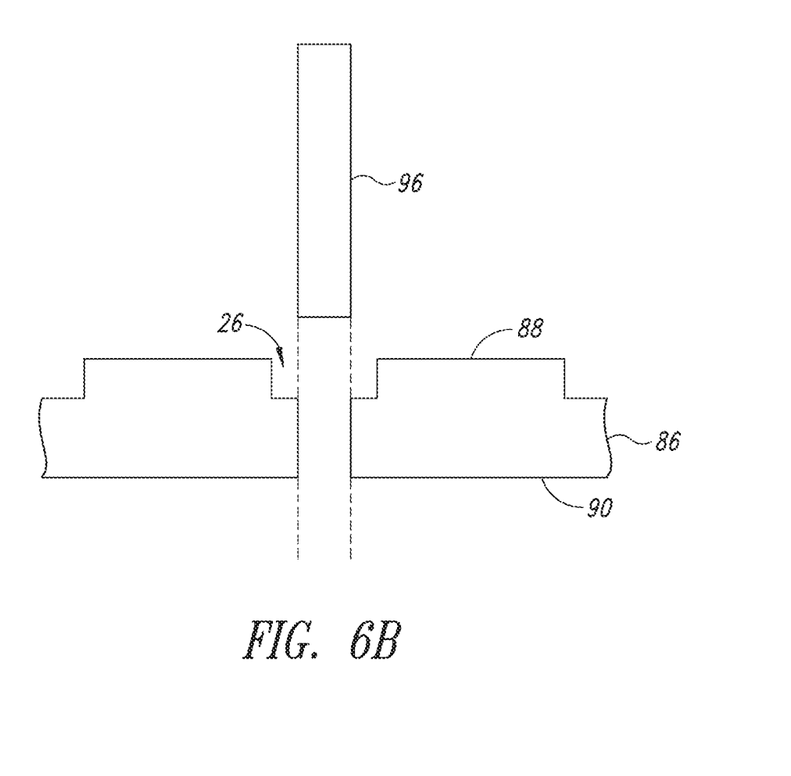

FIGS. 6A and 6B illustrate steps for forming the recesses 26 in the sensor 12 and electric device 62 of FIGS. 1 and 3, respectively, in accordance with one embodiment. FIG. 6A shows a portion of a wafer 86 having a back surface 88 and a front surface 90. A plurality of die may have been formed on the front surface 90 of the wafer 86. The die may include at least one of the sensor 12 and the electric device 62. The front surface 90 of the wafer 86 may be placed on a wafer chuck (not shown) for mechanical support.

A channel 92 having a width is formed in the back surface 88 of the wafer 86. A center of the channel 92 is located in a saw street between the plurality of die. As shown in FIG.

6A, the channel 92 may be formed using a saw blade 94 having a thickness equal to the width of the channel 92 to be formed. A plurality of channels 92 are formed across the back surface 88 of the wafer 86 in an array pattern.

As shown in FIG. 6B, after the channels 92 have been formed in the back surface 88 of the wafer 86, the die are separated using a saw blade 96 having a smaller thickness than the saw blade 94 used to form the channel 92. As best shown in FIG. 6B, the recess 26 is thus formed.

It is to be appreciated that the channel 92 may be formed by other methods. For instance, the channel 92 may be formed by a wet or dry etch process, laser cutting, or any other technique used to form channels in wafers. It is to be appreciated, that the etch process used may depend on the shape of the recess desired. That is, for a square recess, the lateral etch rate will substantially match the vertical etch rate. For a convex shaped recess, the vertical etch rate will be faster than the lateral etch rate. Similarly, the die may be separated from one another by another technique other than sawing, such as laser cutting or any other die singulation technique.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a semiconductor package comprising:
    placing adhesive material between a back surface of an electric device and a surface of a substrate, a front surface of the electric device including a microelectromechanical sensor, the back surface being opposite the front surface, the back surface of the electric device including a recess that extends around an entire perimeter of the back surface; and
    coupling the back surface of the electric device to the surface of the substrate using the adhesive material, wherein the coupling causes the adhesive material to completely fill the recess on the back surface of the electric device and to flow up a side surface of the electric device at the recess adhering the electric device to the substrate.

2. The method of claim 1 wherein the recess forms a protrusion at the back surface of the electric device.

3. The method of claim 1 wherein prior to placing the adhesive material between the back surface of the electric device, the method includes dicing a wafer to separate die of the wafer to form the electric device including the recess.

4. The method of claim 3 wherein the dicing includes:
    using a first saw blade, cutting a back surface of the wafer at a perimeter of each of the plurality of die to a second thickness; and
    using a second blade, cutting the wafer into the plurality of die at the perimeter by cutting through the second thickness and thereby separating the plurality of die from each other to form a plurality of electric devices, the first blade being wider than the second blade such that a recess is formed on at least a portion of the perimeter of each die.

5. The method of claim 1 wherein the recess includes two surfaces that are perpendicular with each other.

6. The method of claim 1 wherein the adhesive material that flows up the side surface of the electric device is located above the recess and forms a fillet.

7. The method of claim 6 wherein the fillet has a height that is less than 75% of the height of the electric device.

8. The method of claim 6 wherein the fillet has a height that is less than 50% of the height of the electric device.

9. A method comprising:
    using a first saw blade, cutting a back surface of a wafer at perimeters of a plurality of die, each of the plurality of die including a microelectromechanical (MEMS) sensor at a first surface, wherein the first surface is opposite the back surface, wherein the wafer has a first thickness, wherein cutting the back surface produces portions at perimeters of a plurality of die causes the portions to have a second thickness that is less than the first thickness;
    using a second blade, cutting the wafer into the plurality of die at the perimeter by cutting through the second thickness and thereby separating the plurality of die from each other, the first blade being wider than the second blade such that a recess is formed on at least a portion of the perimeter of each die; and
    coupling a first die of the plurality of die to a substrate, wherein coupling comprises:
    placing adhesive material on at least one of a back surface of the first die and an upper surface of the substrate;
    placing the back surface of the first die on the upper surface of the substrate; and
    causing the adhesive material to completely fill the recess on the back surface of the die and to flow up the side surface of the die at the recess to adhere the back surface of the first die to the upper surface of the substrate.

10. The method of claim 9 wherein cutting the back surface of the wafer comprises cutting the back surface of the wafer proximate the entire perimeter of each of the plurality of die, and wherein the recess is formed on the entire perimeter of each die.

11. The method of claim 9 wherein the second thickness is less than 50% of the first thickness.

12. The method of claim 9 wherein the second thickness is less than 10% of the first thickness.

13. The method of claim 9 wherein the first blade is at least 10% wider than the second blade.

14. A method of forming a package, the method comprising:
    placing adhesive material on at least one surface chosen among: a back surface of an electric device and a surface of a substrate, the back surface of the electric device having a recess, a front surface of the electric device including a microelectromechanical (MEMS) sensor, the front surface being opposite the back surface;
    placing the back surface of the electric device proximate the surface of the substrate; and
    causing the adhesive material to completely fill the recess on the back surface of the electric device and allowing a portion of the adhesive material to flow up a side surface of the electric device at the recess to adhere the electric device to the substrate.

15. The method of claim 14 wherein the recess is at a perimeter of the electric device.

16. The method of claim 15 wherein the recess extends completely around the entire perimeter of the electric device.

17. The method of claim 14 wherein the portion of the adhesive material flows less than 75% of a height of the electric device.

18. The method of claim 17 wherein the portion of the adhesive material flows less than 50% of a height of the electric device.

19. The method of claim 14 wherein the recess includes two surfaces that are perpendicular with each other.

* * * * *